(12) United States Patent
Liu

(10) Patent No.: US 10,992,319 B2
(45) Date of Patent: Apr. 27, 2021

(54) CODE WORD GENERATING METHOD, ERRONEOUS BIT DETERMINING METHOD, AND CIRCUITS THEREOF

(71) Applicant: SHENZHEN GOODIX TECHNOLOGY CO., LTD., Shenzhen (CN)

(72) Inventor: Xiaozu Liu, Shenzhen (CN)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 37 days.

(21) Appl. No.: 16/139,014

(22) Filed: Sep. 22, 2018

(65) Prior Publication Data
US 2019/0068226 A1    Feb. 28, 2019

Related U.S. Application Data

(63) Continuation of application No. PCT/CN2017/071572, filed on Jan. 18, 2017.

(51) Int. Cl.
*H03M 13/00*    (2006.01)
*H03M 13/19*    (2006.01)
(Continued)

(52) U.S. Cl.
CPC ......... *H03M 13/19* (2013.01); *G06F 11/1012* (2013.01); *G11C 29/42* (2013.01);
(Continued)

(58) Field of Classification Search
CPC .. H03M 13/19; H03M 13/6575; H03M 1/285; H03M 13/1174; H03M 13/1575;
(Continued)

(56) References Cited

U.S. PATENT DOCUMENTS

| | | | |
|---|---|---|---|
| 4,276,647 | A | 6/1981 | Thacker et al. |
| 6,369,921 | B1 | 4/2002 | Blow et al. |
| | | (Continued) | |

FOREIGN PATENT DOCUMENTS

| | | |
|---|---|---|
| CN | 101345606 A | 1/2009 |
| CN | 102378967 A | 3/2012 |
| | (Continued) | |

OTHER PUBLICATIONS

Shu Lin et al. "Linear Block Codes" In: "Error Control Coding", Jan. 1, 1983, Prentice Hall, XP055572263, ISBN: 978-0-13-283796-5, pp. 51-62.

(Continued)

*Primary Examiner* — Albert Decady
*Assistant Examiner* — Osman M Alshack
(74) *Attorney, Agent, or Firm* — Brion Raffoul

(57) ABSTRACT

An erroneous bit determining circuit and a method are provided. The method includes: respectively performing a Hamming operation for an information symbol having an even weight and an information symbol having an odd weight to acquire a check symbol configured for the information symbol having an even weight and a check symbol configured for the information symbol having an odd weight; and respectively generating corresponding code words based on the information symbol having an even weight, the information symbol having an odd weight and the check symbols configured therefor. In this way, information symbols having the same number of bits are corrected without increasing the number of check symbol bits, and thus symbol transmission rate is improved.

7 Claims, 5 Drawing Sheets

(51) Int. Cl.
*H03K 19/21* (2006.01)
*H03M 13/15* (2006.01)
*H04L 1/00* (2006.01)
*G06F 11/10* (2006.01)
*G11C 29/42* (2006.01)

(52) U.S. Cl.
CPC ........ *H03K 19/215* (2013.01); *H03M 13/151* (2013.01); *H03M 13/6575* (2013.01); *H04L 1/0057* (2013.01)

(58) Field of Classification Search
CPC .. H03M 13/151; G06F 11/1012; G11C 29/42; H03K 19/215; H04L 1/0057
USPC ................................ 714/757, 758, 801, 807
See application file for complete search history.

(56) References Cited

U.S. PATENT DOCUMENTS

| | | | | |
|---|---|---|---|---|
| 7,278,085 | B1* | 10/2007 | Weng .................. | G06F 11/1008 714/766 |
| 2005/0055387 | A1 | 3/2005 | Kuekes et al. | |
| 2008/0075176 | A1* | 3/2008 | Karr ........................ | H04J 13/00 375/242 |
| 2009/0110109 | A1* | 4/2009 | Skerlj .................... | H04L 1/0057 375/295 |
| 2015/0039964 | A1* | 2/2015 | Fonseka .............. | H03M 13/253 714/756 |
| 2015/0067012 | A1* | 3/2015 | Goettfert ................ | G06F 17/16 708/520 |
| 2015/0098263 | A1* | 4/2015 | Hirayama ............. | G11C 11/221 365/145 |
| 2016/0006457 | A1* | 1/2016 | Best ...................... | H03M 13/13 714/755 |
| 2016/0352419 | A1* | 12/2016 | Fonseka ............ | H03M 13/2775 |
| 2017/0286217 | A1* | 10/2017 | Kreifels ............ | H03M 13/2942 |
| 2017/0324425 | A1* | 11/2017 | Busch ................. | H03M 13/616 |
| 2017/0371746 | A1* | 12/2017 | Kim ..................... | H03M 13/616 |
| 2018/0248566 | A1* | 8/2018 | Hastings ............... | H03M 13/19 |

FOREIGN PATENT DOCUMENTS

| | | |
|---|---|---|
| CN | 103023518 A | 4/2013 |
| CN | 103684477 A | 3/2014 |
| CN | 104517634 A | 4/2015 |
| CN | 104750569 A | 7/2015 |

OTHER PUBLICATIONS

Saiz-Adalid Luis-J et al: "Ultrafast Error Correction Codes for Double Error Detection/Correction", PROC. 2016 12th European Dependable Computing Conference (EDCC), IEEE, Sep. 5, 2016, pp. 108-119, XP033021883, DOI: 10.1109/EDCC.2016.28 (retrieved on Dec. 9, 2016), p. 110, left-hand column—p. 116, left-hand column.

Bose B Ed—Institute of Electrical and Electronics Engineers: "Byte unidirectional error correcting codes", PROC. International Symposium on Fault Tolerant Computing (FTCS), Chicago, Jun. 20-23, 1989, IEEE Comp. SoC. Press, US, Jun. 21, 1989, pp. 222-228, XP032356726, DOI: 10.1109/FTCS.1989.105570, ISBN: 978-0-8186-1959-5, p. 223, left-hand column—p. 225, right-hand column.

Chen C L et al.: "Error-Correcting codes for Semiconductor Memory Applications: A State-of-the-Art Review", IBM Journal of Research and Development, International Business Machines Corporation, New York, NY, US, vol. 28, No. 2, Mar. 1, 1984, pp. 124-134, XP000652208, ISSN: 0018-8646, p. 125, right-hand column—p. 128, right-hand column.

* cited by examiner

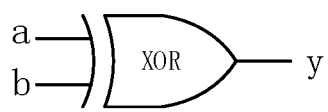
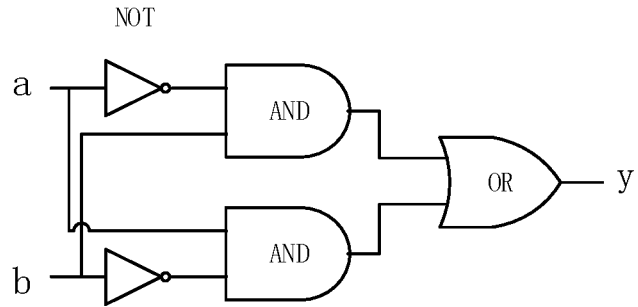
FIG. 5A  FIG. 5B
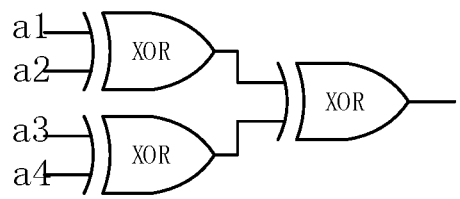
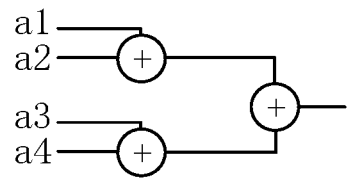
FIG. 6A  FIG. 6B
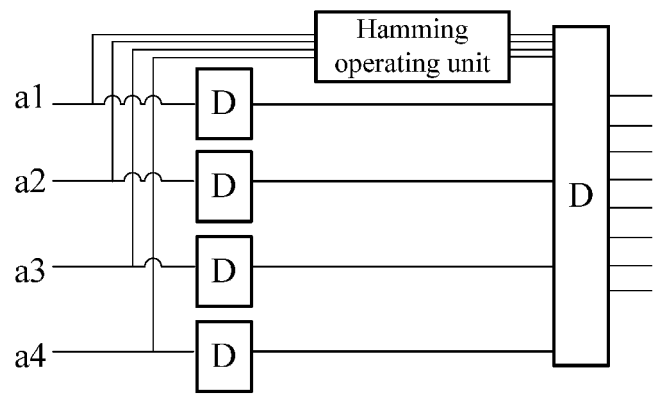
FIG. 7

CODE WORD GENERATING METHOD, ERRONEOUS BIT DETERMINING METHOD, AND CIRCUITS THEREOF

CROSS-REFERENCE TO RELATED APPLICATIONS

The present application is a continuation of international application No. PCT/CN2017/071572 filed on Jan. 18, 2017, which is hereby incorporated by reference in its entirety.

TECHNICAL FIELD

Embodiments of the present disclosure relate to the technical field of fault tolerance computing, and in particular, relate to a code word generating method, an erroneous bit determining method and circuits thereof.

BACKGROUND

Error correcting code is an important fault-tolerant computing technology, and is extensively applied in communication and computer systems, which greatly enhances reliability of the system.

Traditional error correcting coding theories are all based on assumption of symmetric errors. For example, in a communication system, a 0→1 error may be caused, or a 1→0 error may be caused. In the memory of an integrated circuit, for example, in a one time programmable (OTP) memory, data of each bit in the device is defaulted to be 0, and the data of the corresponding bit is changed from the default value 0 to 1 by means of charge and discharge and the like, or changed from 1 to the default value 0. In the memory, the data of each bit may be subject to the 0→1 or 1→0 error.

In the prior art, since the code word of the [7,4] Hamming code has a maximum of 7 bits and the check symbol has only 3 bits, if the [7,4] Hamming code needs to be applied to an OTP memory implementing 8-bit storage, a 1-bit check symbol needs to be added based on the current [7,4] Hamming code. As a result, the symbol transmission rate is low.

SUMMARY

Embodiments of the present disclosure are intended to provide a code word generating method, an erroneous bit determining method and circuits thereof, to at least solve the above problem in the prior art.

To achieve the objectives of embodiments of the present disclosure, embodiments of the present disclosure provide a code word generating method. The method includes:

respectively performing a Hamming operation for an information symbol having an even weight and an information symbol having an odd weight to acquire a check symbol configured for the information symbol having an even weight and a check symbol configured for the information symbol having an odd weight; and respectively generating corresponding code words based on the information symbol having an even weight and the check symbol configured for the information symbol having an odd weight and the check symbols configured therefor.

Embodiments of the present disclosure further provide an erroneous bit determining method, including:

preliminarily judging, based on a check relationship between an information symbol and a check symbol in a code word in any code word generating embodiment, at least one possible erroneous bit in the code word; and determining a practical erroneous bit in the at least one possible erroneous bit based on a code weight variation of the information symbol or the check symbol in the code word to be checked relative to the information symbol or the check symbol in the code word generated in the above embodiment.

Embodiments of the present disclosure further provide a code word generating circuit, including:

a Hamming operating unit, configured to respectively perform a Hamming operation for an information symbol having an even weight and an information symbol having an odd weight to acquire a check symbol configured for the information symbol having an even weight and a check symbol configured for the information symbol having an odd weight; and a code word generating unit, configured to respectively generate corresponding code words based on the information symbol having an even weight and a check symbol configured for the information symbol having an odd weight and the check symbols configured therefor.

Embodiments of the present disclosure further provide an erroneous bit determining circuit, including:

a code word checking unit, configured to preliminarily judge, based on a check relationship between an information symbol and a check symbol in a code word in any code word generating embodiment, at least one possible erroneous bit in the code word; and an erroneous bit determining unit, configured to determine a practical erroneous bit in the at least one possible erroneous bit based on a code weight variation of the information symbol or the check symbol in the code word to be checked relative to the information symbol or the check symbol in the code word generated in the above embodiment.

In embodiments of the present disclosure, by respectively performing a Hamming operation for an information symbol having an even weight and an information symbol having an odd weight, a check symbol configured for the information symbol having an even weight and a check symbol configured for the information symbol having an odd weight are acquired; and corresponding code words are respectively generated based on the information symbol having an even weight, the information symbol having an odd weight and the check symbols configured therefor. In this way, information symbols having the same number of bits are corrected without increasing the number of check symbol bits, and thus symbol transmission rate is improved.

BRIEF DESCRIPTION OF THE DRAWINGS

FIG. 5A and FIG. 5B are exemplary schematic circuit structural diagrams of an Exclusive OR unit according to a fifth embodiment of the present disclosure;

FIG. 6A and FIG. 6B are exemplary schematic circuit structural diagrams of a first checking unit according to a sixth embodiment of the present disclosure;

FIG. 7 is an exemplary schematic structural diagram of a code word generating circuit according to a seventh embodiment of the present disclosure;

DETAILED DESCRIPTION

Figure 1:
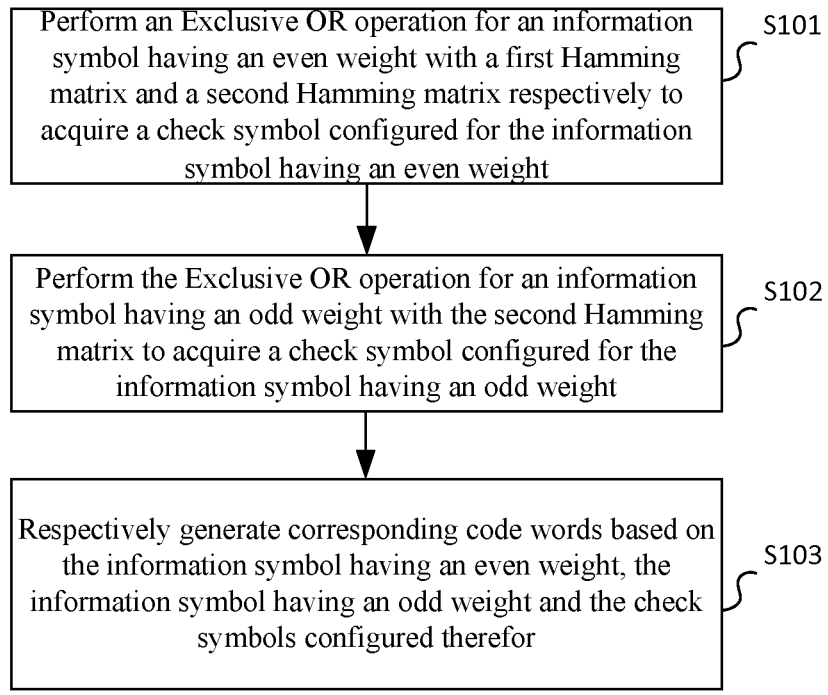
FIG. 1 is a schematic flowchart of a code word generating method according to a first embodiment of the present disclosure.

Practice of the present application is described in detail with reference to drawings and specific embodiments, such that the practice of addressing the technical problem using the technical means according to the present application and achieving the technical effects may be better understood and conducted.

An embodiment of the present disclosure hereinafter provides a code word generating method, including: respectively performing a Hamming operation for an information symbol having an even weight and an information symbol having an odd weight to acquire a check symbol configured for the information symbol having an even weight and a check symbol configured for the information symbol having an odd weight; and respectively generating corresponding code words based on the information symbol element having an even weight and the check symbol configured for the information symbol element having an odd weight and the check symbols configured therefor. In the embodiment hereinafter, when the Hamming operation is performed for the information symbol having an even weight and the information symbol having an odd weight, specifically an Exclusive OR operation is performed for the information symbol having an even weight and the information symbol having an odd weight with an assigned Hamming matrix to different check symbols configured for the information symbol having an even weight and for the information symbol having an odd weight respectively. An embodiment which illustrates the detailed Exclusive OR operation is given hereinafter.

In the embodiment hereinafter of the present disclosure, description is given by using the scenario where the method is applied to an OTP memory as an example. When data is stored in an OTP memory, one byte is used as a code word and includes 8 bits, where 4 bits are used as an information symbol and the remaining 4 bits are used as a check symbol. Among these 8 bits, generally only one bit may be subjected to an error which is a 1→0 error or a 0→1 error. That is, it is impossible that a 1→0 error and a 0→1 error are simultaneously present in the same 8-bit code word.

The inventive concept of the present disclosure is described in the embodiment hereinafter in detail with reference to the above features of one time programmable (OTP) memory.

In this embodiment, considering that only the error symbol may have only 1 bit during data storage in an OTP memory, different check symbols that may be used to correct the error 1-bit information symbol may be generated by using conventional Hamming coding, and thus a first Hamming matrix and a second Hamming matrix are respectively formed.

Using a 3-bit check symbol (a4a2a1) as an example, the 3-bit check symbol may form a 4-bit code word (a4a3a2a1) with a 1-bit information symbol (a3), where the bit sequence from right to left is bit 1, bit 2, bit 3 and bit 4. The first Hamming matrix and the second Hamming matrix are generated based on the Hamming coding by observing the following rules:

(1) The check symbol is arranged at the position of the power of a bit whose serial number is 2 in the code word based on the sequence of the more-significant and less-significant bits.

If the information symbol has 1 bit and the check symbol has 3 bits, a4 is arranged at bit 4, a2 is arranged at bit 2 and a1 is arranged at bit 1.

(2) The information symbol is arranged at the position of the power of a bit whose serial number is 2 in the code word. In this embodiment, a3 is arranged at bit 3.

With respect to the above 1-bit information symbol and 3-bit check symbol, correction may be made based on the check rules of the [7,4] Hamming code. The check rules of the [7,4] Hamming code are as follows:

$a1=a3 \oplus a5 \oplus a7$, $a2=a3 \oplus a6 \oplus a7$, $a4=a5 \oplus a6 \oplus a7$.

With respect to the 1-bit information symbol and 3-bit check symbol, a5, a6 and a7 are all 0 in the above check rules, such that the check rules used in the following embodiment are a4=a3, a2=a3 and a4=0. Since a linear restriction relationship is defined between the information symbol and the check symbol, the corresponding check symbol may be acquired based on the information symbol. In the following embodiment of the present disclosure, description is given by using the check rules a4=a3, a2=a3 and a4=0.

Referring to the linear restriction relationship a4=a3, a2=a3 and a4=0 between the information symbol and the check symbol, it is known that when the information symbol a2=1, a code word a4a3a2a1, specifically, 0111, is obtained; and when the information symbol a2=0, a code word a4a3a2a1, specifically, 0000, is obtained. In this case, [0 1 1 1] is used as the first Hamming matrix, and the first Hamming matrix is practically a non all-0 code matrix; and [0 0 0 0] is used as the second Hamming matrix, and the second Hamming matrix is practically an all-0 code matrix.

It should be noted that, in other embodiments, other rules may also be customized. For example, the more-significant bits and the less-significant bits in the code word are respectively defined as the information symbol and the check symbol. With respect to the [7,4] Hamming code, in the code word a7a6a5a4a3a2a1, a7a6a5a4 represents the information symbol, and a3a2a1 represents the check symbol. Therefore, the corresponding check rules may be $a3=a7 \square a6 \square a5$, $a2=a7 \square a6 \square a4$, $a1=a7 \square a5 \square a4$, which are not described herein any further.

FIG. 1 is a schematic flowchart of a code word generating method according to a first embodiment of the present disclosure. As illustrated in FIG. 1, the method includes the following steps:

S101: An Exclusive OR operation is performed for an information symbol having an even weight with a first Hamming matrix and a second Hamming matrix respectively to acquire a check symbol configured for the information symbol having an even weight.

In this embodiment, with respect to an even parity, the number of bits whose data is 1 in the information symbol is the weight of the symbol. For example, the number of bits whose data is 1 in the information symbol 1001 is 2, the corresponding weight is 2, and the information symbol 1001 is the information symbol having an even weight.

In this embodiment, an Exclusive OR operation is performed for the 4-bit information symbol 1001, as an example, with the first Hamming matrix [0 1 1 1] and the second Hamming matrix [0 0 0 0] to acquire the check symbols 1001 and 1110 configured therefor. When the Exclusive OR operation is performed for the information symbol with the first Hamming matrix and the second Hamming matrix, the bits in the information symbol may be aligned with the symbols in the first Hamming matrix and the second Hamming matrix, and then the Exclusive OR operation is performed. That is, the Exclusive OR operation is performed for the symbol at the more-significant bit and the symbol at the less-significant symbol in the information symbols and the corresponding symbol at the more-significant bit and symbol at the less-significant symbol in the first Hamming matrix and the second Hamming matrix.

S102: The Exclusive OR operation is performed for an information symbol having an odd weight with the second Hamming matrix to acquire a check symbol configured for the information symbol having an odd weight.

In this embodiment, with respect to an even parity, the number of bits whose data is 1 in the information symbol is counted. If the number is an even number, the weight of the information symbol is an odd number. For example, the number of bits whose data is 1 in the information symbol 0111 is 3, the corresponding weight is 3, and the information symbol 0111 is the information symbol having an odd weight. When the Exclusive OR operation is performed for the information symbol having an odd weight with the second Hamming matrix, the information symbol needs to be likewise aligned with the symbol in the second Hamming matrix.

In this embodiment, an Exclusive OR operation is performed for the information symbol 0111, as an example, with the second Hamming matrix [0 0 0 0] to acquire the check symbol 0111 configured therefor.

During generation of the check symbol in steps S101 and S102, different Hamming matrices are used, such that the differences between the generated code words are reduced. As such, it means that available code words are increased, which is essentially equivalent to an increase of the number of bits of the information symbol. In this way, the symbol transmission rate is improved.

In this embodiment, step S101 and step S102 are subject to no absolutely time sequence. To be specific, step S102 may be performed prior to step S102, or step S101 and step S102 may be parallelly performed.

S103: Corresponding code words are respectively generated based on the information symbol having an even weight, the check symbol configured for the information symbol having an odd weight and the check symbols configured therefor.

In this embodiment, through steps S101 and S102, the corresponding check symbols configured for the information symbol having an even weight and the information symbol having an odd weight are respectively acquired; and the corresponding code words may be acquired by combining the information symbols with the check symbols.

In this embodiment, the code word 01110111 is obtained by combining the information symbol 0111, as an example, with the check symbol 0111 configured therefor.

In this embodiment, two code words 10011001 and 1001110 are respectively acquired by respectively combining the information symbol 1001, as an example, with the check symbols 1001 and 1110 configured therefor. In this embodiment, since two available check symbols are acquired by performing an operation for each information symbol having an even weight with the first Hamming matrix and the second Hamming matrix respectively, two available code words are correspondingly acquired. Relative to the scenario where one information symbol corresponds to one available check symbol in the prior art and hence corresponds to one available code word, the number of bits of the information symbol is essentially increased, and thus the symbol transmission rate is improved.

Alternatively, in another embodiment, the first Hamming matrix and the second Hamming matrix may be interchanged, which is not described herein any further.

Figure 2:
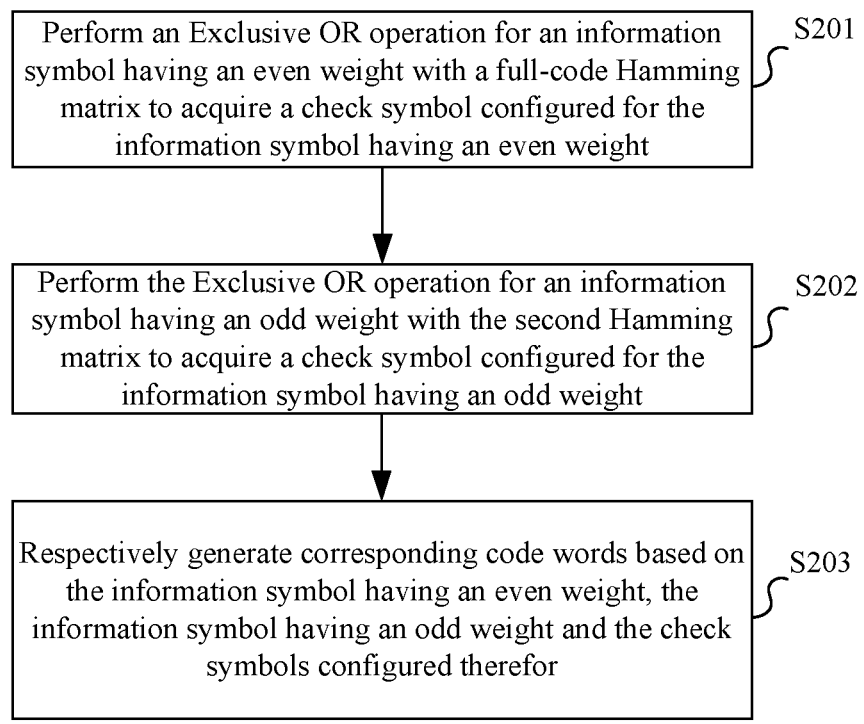
FIG. 2 is a schematic flowchart of a code word generating method according to a second embodiment of the present disclosure.

FIG. 2 is a schematic flowchart of a code word generating method according to a second embodiment of the present disclosure. As illustrated in FIG. 2, the method includes the following steps:

S201: An Exclusive OR operation is performed for an information symbol having an even weight with a full-code Hamming matrix to acquire a check symbol configured for the information symbol having an even weight.

In this embodiment, the first Hamming matrix and the second Hamming matrix may be combined to form a full-code Hamming matrix, and an Exclusive OR operation is directly performed for the information symbol having an even weight with the full-code Hamming matrix to generate a corresponding check symbol.

In this embodiment, an Exclusive OR operation is performed for the information symbol 1001, as an example, with the full-code Hamming matrix [0 1 1 1, 0 0 0 0] to acquire the check symbols 1001 and 1110 configured therefor.

S202: An Exclusive OR operation is performed for an information symbol having an odd weight with the second Hamming matrix to acquire a check symbol configured for the information symbol having an odd weight.

In this embodiment, step S202 is similar to step S201 in the above embodiment, which is not described herein any further.

S203: Corresponding code words are respectively generated based on the information symbol having an even weight, the information symbol having an odd weight and the check symbols configured therefor.

In the above embodiment, prior to steps S101 and S201, the code word generating method may further include: separating the input information symbol to acquire the information symbol having an even weight and the information symbol having an odd weight. The details are not given herein any further.

In the above exemplary embodiment illustrating the code word generating method, an 8-bit code word in the OTP memory is generated and mapped to a parity of a 4-bit code word, and then an Exclusive OR operation is performed for the 4-bit information symbol in the 8-bit code word with the Hamming matrix generated during the process of generating the 4-bit code word, such that a 4-bit check symbol in the 8-bit code word is acquired. Since a 3-bit check symbol is used during the process of generating the 4-bit code word, with respect to the 8-bit code word, it is likewise signified that the 8-bit code word is generated by only using the 3-bit check symbol, such that the symbol transmission rate during code word generation is improved.

Analogously, with respect to a 10-bit, 12-bit, 14-bit and the like code word, the 10-bit code word, the 12-bit code word and the 14-bit code word are respectively mapped to checking of a 5-bit code word, a 6-bit code word and a 7-bit code word. Afterwards, with reference to the above Hamming coding rules of the 4-bit code word, an Exclusive OR operation is performed for a 5-bit information symbol, a 6-bit information symbol and a 7-bit information symbol having the corresponding weights respectively with an all-0 code Hamming matrix similar to the first Hamming matrix and a non all-0 code Hamming matrix that are generated during the process of generating the 5-bit code word (a 2-bit information symbol and a 3-bit check symbol) and the 7-bit code word (a 4-bit information symbol and a 3-bit check symbol), such that a 5-bit check symbol, a 6-bit check symbol and a 7-bit check symbol of the corresponding information symbols in the 10-bit code word, the 12-bit code word and the 14-bit code word. During the checking of the 5-bit code word, the 6-bit code word and the 7-bit code word, based on the Hamming coding rules, the 3-bit check symbol is used, which signifies that the 10-bit code word, the 12-bit code word and the 14-bit code word are generated by only using the 3-bit check symbol, such that the symbol transmission rate during code word generation is improved.

In addition, a plurality of first Hamming matrices may be obtained based on the 10-bit code word, the 12-bit code word and the 14-bit code word. Therefore, an Exclusive OR operation is performed for the information symbol having an even weight with each of the plurality of first Hamming matrices, such that a plurality of check symbols peer to the plurality of first Hamming matrices are obtained. As such, the number of code words that are generated is increased, such that more data is stored.

In an erroneous bit determining method according to an embodiment of the present disclosure hereinafter, at least one possible erroneous bit in the code word is preliminarily judged based on a check relationship between an information symbol and a check symbol in a code word to be checked; and a practical erroneous bit in the at least one possible erroneous bit is determined based on a code weight variation of the information symbol or the check symbol in the code word to be checked relative to the information symbol or the check symbol in the code word generated in the above embodiments. The specific embodiment may be referenced to the exemplary interpretation in FIG. 3 and FIG. 4.

Figure 3:
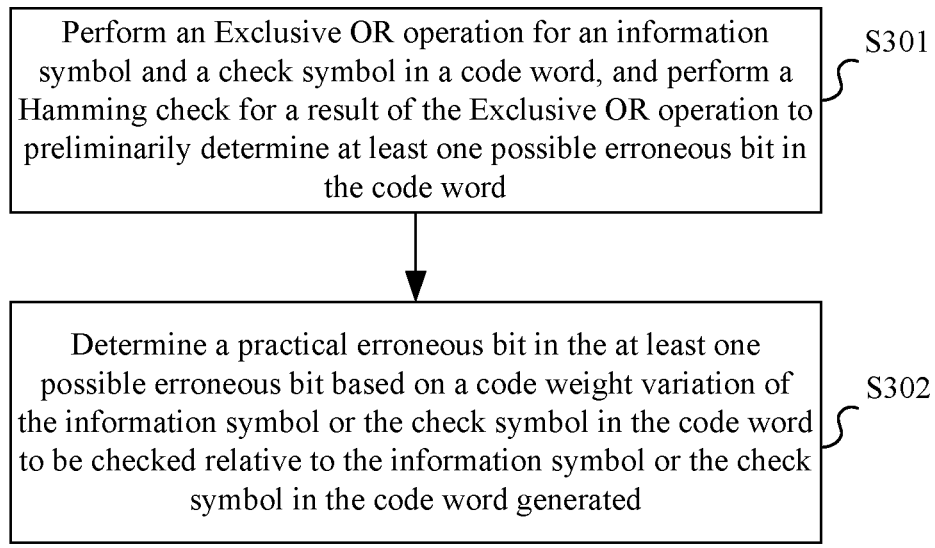
FIG. 3 is a schematic flowchart of an erroneous bit determining method according to a third embodiment of the present disclosure.

FIG. 3 is a schematic flowchart of an erroneous bit determining method according to a third embodiment of the present disclosure. As illustrated in FIG. 3, the method includes the following steps:

S301: An Exclusive OR operation is performed for an information symbol and a check symbol in a code word, and a Hamming check is performed for a result of the Exclusive OR operation to preliminarily judge at least one possible erroneous bit in the code word.

In this embodiment, still using error correction of an 8-bit code word in an OTP memory as an example, the 8-bit code word includes a 4-bit information symbol and a 4-bit check symbol, and an Exclusive OR operation is performed for the 4-bit information symbol and the 4-bit check symbol such that the code word in the Hamming check is reduced from 8 bits to 4 bits, which is equivalent to a dimension reduction. In this way, based on the Hamming check rules of the 4-bit code word, erroneous bits in the 4-bit code word may be preliminarily judged by, for example, calculating a correction factor or making a comparison with the code words which are used as the first Hamming matrix and the second Hamming matrix. Since the 4-bit code word is mapped from the 8-bit code word, erroneous bits in the 8-bit code word are indirectly inferred based on the erroneous bits in the 4-bit code word.

For example, if the 8-bit code word to be checked is 10011001 where the sequence of the symbols from right to left is bit 8, . . . , bit 1, an Exclusive OR result of the information symbol 1001 in the 8-bit code word and the check symbol 1001 in the 8-bit code word is equal to 0000. A Hamming check for the Exclusive OR result 0000 indicates that the 8-bit code word 10011001 has no erroneous bit.

Still for example, if the 8-bit code word to be checked is 10011010, an Exclusive OR result of the information symbol 1001 in the 8-bit code word and the check symbol 1010 in the 8-bit code word is equal to 0011. Since the 4-bit code words has only one erroneous bit, that is, a single-bit error, the Exclusive OR result is compared with the first Hamming matrix, such that it is determined that bit 3 in the 4-bit code word encounters an error. However, bit 3 in the 4-bit code word is correspondingly bit 3 or bit 7 in the 8-bit code word. In this case, it is preliminarily judged that the at least one possible erroneous bit in the 8-bit code word is bit 3 or bit 7.

In this embodiment, in step S301, before the Exclusive OR operation is performed for the information symbol and the check symbol in the code word, the information symbol and the check symbol in the code word may be firstly aligned and the Exclusive OR operation is performed for the information symbol and the check symbol in the code word upon the alignment. That is, the more-significant bit in the 4-bit information symbol is aligned with the more-significant bit in the 4-bit check symbol, and the less-significant bit in the 4-bit information symbol is aligned with the less-significant bit in the 4-bit check symbol.

Step 302: A practical erroneous bit in the at least one possible erroneous bit is determined based on a code weight variation of the information symbol or the check symbol in the code word to be checked relative to the information symbol or the check symbol in the code word generated in the above embodiment.

In this embodiment, if the weight of the information symbol in the 8-bit code word is changed, the erroneous bit in the 8-bit code word may be located in the information symbol, that is, the weight of the information symbol in the currently input 8-bit code word is compared with the weight of the information symbol in the 8-bit code word generated in the above embodiment to determine the change of the weight; and if the weight of the check symbol in the 8-bit code word is changed, the erroneous bit in the 8-bit code word may be located in the check symbol. Therefore, in this embodiment, the practical erroneous bit in the code word may be determined based on the weight change of the information symbol or the check symbol in the check symbol.

As described above, it is preliminarily judged that the at least one possible erroneous bit in the 8-bit code word 100110100 to be checked may be bit 3 or bit 7. The weight of the information symbol in the 8-bit code word to be checked is 2, which is not changed relative to the information symbol in the code word 1001110 generated in the embodiments as illustrated in FIG. 1 and FIG. 2. Therefore, the practical erroneous bit is located in the check symbol, that is, bit 3 is the practical erroneous bit.

It should be noted that the judgment of the practical error may also be judged based on the weight change of the information symbol, which is not described herein any further.

It should be noted that the scenario where the code word to be checked has 10 bits, 12 bits or 14 bits is similar to the scenario where the code word to be checked has 8 bits as described above, which is not described herein any further.

Based on the embodiment as illustrated in FIG. 3, prior to step S301, the method may further include: performing packet processing for the code word to be checked to acquire the information symbol and the check symbol therein.

In another embodiment, after the erroneous bit is finally determined as illustrated in FIG. 3, the practical erroneous bit may be corrected based on a pre-known error type.

Specifically, as described above, using an OTP memory as an example, since only a 1→0 error or a 0→ error may occur and this error may be pre-known based on the relevant method in the prior art. Therefore, based on the above embodiment, assume that the pre-known error is a 1→0 error, then in the embodiment as illustrated in FIG. 3, bit 3 in the code word 10011010 to be checked is corrected from 0 to 1, that is, the corrected code word is 10011110, that is, a correct code word.

It should be noted that if the pre-known error is a 0→1 error, under inspirations of the above embodiments, persons of ordinary skill in the art may correct the erroneous bit by only referring to the related disclosure of the 1→0 error without paying any creative effort.

An embodiment of the present disclosure hereinafter further provides a code word generating circuit. The circuit includes: a Hamming operation unit and a code word generating unit. The Hamming operation unit is configured to respectively perform a Hamming operation for an information symbol having an even weight and an information symbol having an odd weight, to acquire a check symbol configured for the information symbol having an even weight and a check symbol having an odd weight respectively. The code word generating unit is configured to respectively generate corresponding code words based on the information symbol having an even weight and the check symbol configured for the information symbol having an odd weight and the check symbols configured therefor.

Figure 4:
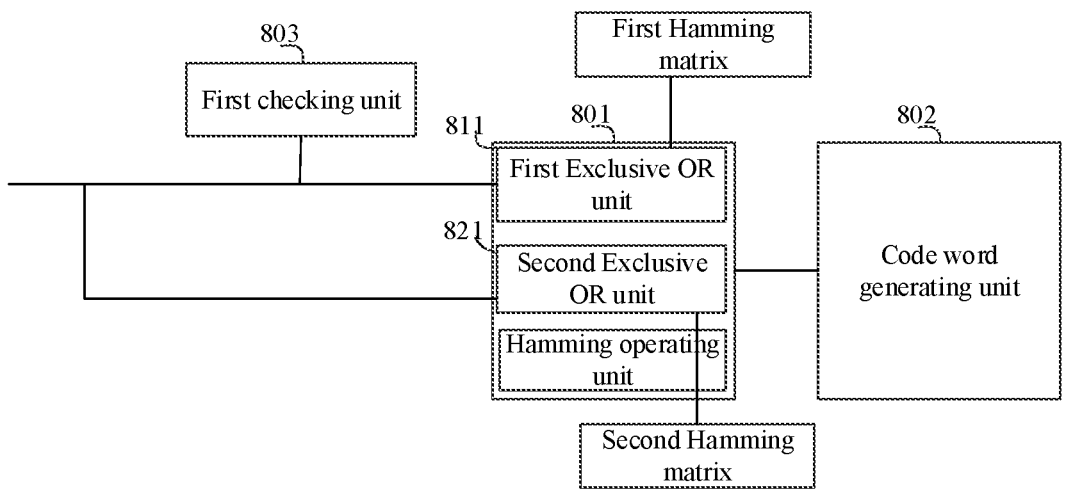
FIG. 4 is a schematic structural diagram of a code word generating circuit according to a fourth embodiment of the present disclosure.

FIG. 4 is a schematic structural diagram of a code word generating circuit according to a fourth embodiment of the present disclosure. As illustrated in FIG. 4, the code word generating circuit includes a Hamming operating unit 801 and a code word generating unit 802. The code word generating unit 802 is configured to respectively generate corresponding code words based on the information symbol having an even weight, the information symbol having an odd weight and the check symbols configured therefor. In this embodiment, the Hamming operating unit 801 specifically includes: a first Exclusive OR unit 811 and a second Exclusive OR unit 821. The first Exclusive OR unit 811 is configured to respectively perform an Exclusive OR operation for the information symbol having an even weight with a first Hamming matrix and a second Hamming matrix to acquire the check symbol configured for the information symbol having an even weight. The second Exclusive OR unit 821 is configured to perform an Exclusive OR operation for the information symbol having an odd weight with the second Hamming matrix to acquire the check symbol configured for the information symbol having an odd weight.

In addition, in this embodiment, the code word generating circuit may further include: a first checking unit 803, configured to perform an even parity for the code word, and transmit the information symbol having an even weight to the first Exclusive OR unit 811 such that an Exclusive OR operation is performed between the information symbol having an even weight and the first Hamming matrix.

In another embodiment, alternatively, the first Exclusive OR unit 811 is configured to respectively perform an Exclusive OR operation for the information symbol having an even weight with a first Hamming matrix and a second Hamming matrix to acquire the check symbol configured for the information symbol having an even weight; and the second Exclusive OR unit 821 is configured to respectively perform an Exclusive OR operation for the information symbol having an even weight with a first Hamming matrix and a second Hamming matrix to acquire the check symbol configured for the information symbol having an even weight. Accordingly, the first checking unit 803 may perform an odd parity for the code word, and transmit the information symbol having an odd weight to the first Exclusive OR unit 811, such that an Exclusive OR operation is performed for the information symbol having an odd weight with the first Hamming matrix.

In this embodiment, the first Exclusive OR unit 811 and the second Exclusive OR unit 821 may be specifically practiced by using a basic Exclusive OR gate, AND gate, OR gate, NAND gate, or NOR gate circuit device. Using single-bit input Exclusive OR as an example, the exemplary structure may be referenced to FIG. 5A and FIG. 5B. FIG. 5A illustrates an Exclusive OR unit formed by a reference Exclusive OR gate, for example, a first Exclusive OR unit 811 and a second Exclusive OR unit 821. FIG. 5B illustrates an Exclusive OR unit formed by a reference AND, OR and NOT gate, for example, a first Exclusive OR unit 811 and a second Exclusive OR unit 821. A multi-bit input is only expansion of the single-bit input, which is not described herein any further.

The first checking unit 803 may be specifically practiced by bit-by-bit Exclusive OR operations of a single-bit Exclusive OR gate circuit or bit-by-bit addition of an adder circuit. The exemplary structure thereof may be referenced to FIG. 6A and FIG. 6B. In FIG. 6A and FIG. 6B, a1, a2, a3 and a4 are respectively equivalent to data of different bits from the least-significant bit to the most-significant bit in the information symbol in the above 8-bit code word.

The code word generating unit 802 may be specifically practiced by a circuit device such as a latch D and the like having the storage function. An exemplary code word generating circuit obtained in combination of the above Hamming operating unit may be referenced to FIG. 7. As illustrated in FIG. 7, a 4-bit information symbol is input, where a1 a2a3a4 are respectively equivalent to bit 1 to bit 4 in the above 4-bit information symbol, and the above 4-bit check symbol is generated by using the above Hamming operating unit. A corresponding 8-bit code word is generated based on the 4-bit information symbol and the 4-bit check symbol by the latch of the code word generating unit 802.

Figure 8:
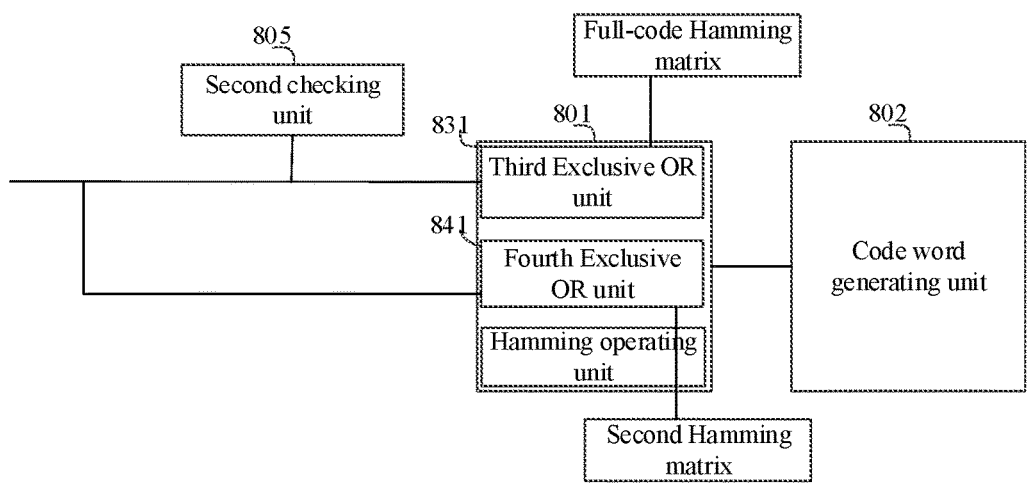
FIG. 8 is a schematic structural diagram of a code word generating circuit according to an eighth embodiment of the present disclosure.

FIG. 8 is a schematic structural diagram of a code word generating circuit according to an eighth embodiment of the present disclosure. As illustrated in FIG. 8, the Hamming operating unit 801 includes: a third Exclusive OR unit 831 and a fourth Exclusive OR unit 841. The third Exclusive OR unit 831 is configured to respectively perform an Exclusive OR operation for the information symbol having an even weight with a full-code Hamming matrix to acquire the check symbol configured for the information symbol having an even weight. The second Exclusive OR unit 821 is configured to perform an Exclusive OR operation for the information symbol having an odd weight with the second Hamming matrix to acquire the check symbol configured for the information symbol having an odd weight.

In this embodiment, the code word generating circuit may further include: a separating unit 804, configured to separate input information symbols to acquire the information symbol having an even weight and the information symbol having an odd weight.

In this embodiment, the code word generating circuit may further include: a second checking unit 805, configured to perform an even parity for the code word, and hence transmit the information symbol having an even weight to the third Exclusive OR unit 821 and transmit the information symbol having an odd weight to the fourth Exclusive OR unit 841.

In another embodiment, the second checking unit may perform an odd parity for the code word. The scenario of the odd parity may be referenced to FIG. 4, which is not described herein any further.

The third Exclusive OR unit 831, the fourth Exclusive OR unit 841 and the second checking unit 805 may be referenced to FIG. 5A, FIG. 5B, FIG. 6A and FIG. 6B, which are not described herein any further.

An embodiment hereinafter of the present disclosure further provides an erroneous bit determining circuit. The circuit includes: a code word checking unit, configured to preliminarily judge, based on a check relationship between an information symbol and a check symbol in a code word to be checked, at least one possible erroneous bit in the code word; and an erroneous bit determining unit, configured to determine a practical erroneous bit in the at least one possible erroneous bit based on a code weight variation of the information symbol or the check symbol in the code word to be checked relative to the information symbol or the check symbol in the code word generated in FIG. 1 and FIG. 2.

Figure 9:
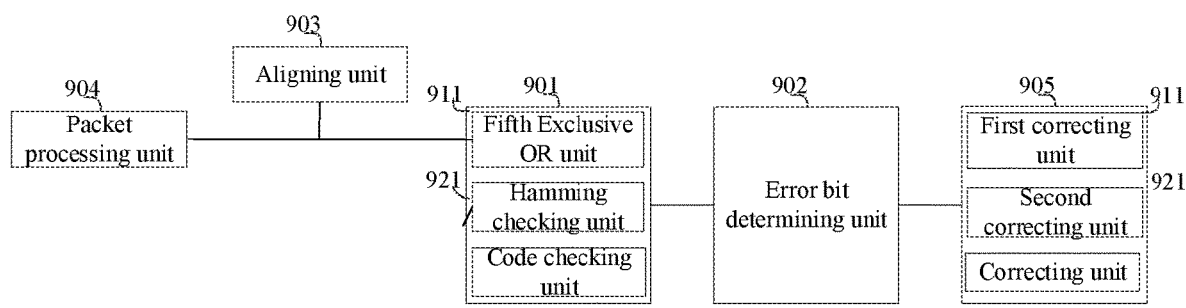
FIG. 9 is an exemplary schematic structural diagram of an erroneous bit determining circuit according to a ninth embodiment of the present disclosure.

FIG. 9 is an exemplary schematic structural diagram of an erroneous bit determining circuit according to a ninth embodiment of the present disclosure. In this embodiment, the erroneous bit determining circuit includes: a code word checking unit 901 and an erroneous bit determining unit 902. The code word checking unit 901 includes a fifth Exclusive OR unit 911 and a Hamming checking unit 921. The fifth Exclusive OR unit 911 is configured to perform an Exclusive OR operation for an information symbol and a check symbol in a code word to be checked. The Hamming checking unit 921 is configured to perform a Hamming check for a result of the Exclusive OR operation to preliminarily judge at least one possible error in the code word.

Figure 10:
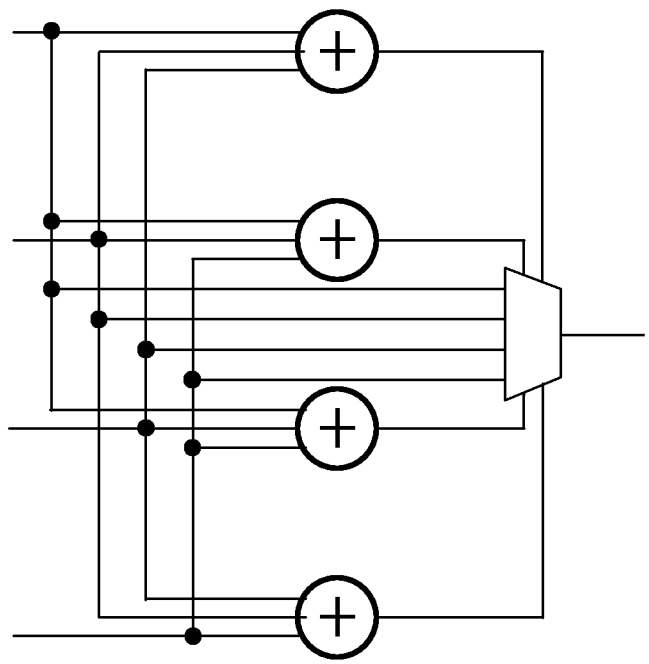
FIG. 10 is a schematic structural diagram of a specific implementation circuit of a code word checking unit according to a tenth embodiment of the present disclosure.

The specific circuit of the code word checking unit 901 may be as illustrated in FIG. 10, and includes the fifth Exclusive OR unit 911 and a multiplexer MUX as the Hamming checking unit 921. The specific circuit structure may be generated based on the Hamming checking rules formulated according to the 1-bit information symbol and the 3-bit check symbol.

In this embodiment, the erroneous bit determining circuit further includes: an aligning unit 903, configured to align the information symbol with the check symbol in the code word to be checked, such that the fifth Exclusive OR unit 911 performs the Exclusive OR operation for the aligned information symbol and check symbol in the code word.

In this embodiment, the circuit structure of the aligning unit may be specifically a 4-bit storage unit, for example, a trigger, a latch, a shift register or the like. Input data is buffered, and then the more-significant 4 bits and the less-significant 4 bits of the data are recombined. As such, the information symbol and the check symbol in the code word to be checked are aligned.

In this embodiment, the erroneous bit determining circuit may further include: a packet processing unit 904, configured to separate the code word to be checked to acquire the information symbol and the check symbol therein. The packet processing unit 904 includes a code word prefix separating unit 804 and a code word suffix separating unit 804. The code word prefix separating unit 804 is configured to separate the information symbol from the code word, and the code word suffix separating unit 804 is configured to separate the check symbol from the code word.

In this embodiment, if the information symbol and the check symbol in the code word to be checked are serially input, a counter may be used as the packet processing unit 904 based on a sequence of the more-significant bits thereof, such that separation is implemented. Specifically, the input code word to be checked is counted cyclically from 1 to 8, and the input less than 4 and the input greater than 4 are respectively bits of the information symbol and bits of the check symbol.

In another embodiment, if the information symbol and the check symbol in the code word to be checked are parallelly input, the above packet processing unit 904 may be omitted.

In this embodiment, the erroneous bit determining unit 902 may specifically include: two multiplexers MUX 1 and MUX 2, and an OR gate arranged between the two multiplexers MUXs. Two input terminals of the multiplexer MUX 1 are respectively configured to receive data of the preliminarily judged at least one possible erroneous bit in the code word, and the data of the preliminarily judged at least one possible erroneous bit in the code word is selectively output via the multiplexer MUX 1 and an Exclusive OR operation is performed for the data with data 1 (which indicates that the pre-known error type is 1→0) at the OR gate, a final erroneous bit is determined based on the scenario where the output of the OR gate is 1, and the final erroneous bit is output and the correcting unit is enabled to correct the final erroneous bit. In the above embodiment, assume that the inputs of bit 3 and bit 7 are correspondingly [01] and the outputs of these two bits are respectively used as gate signals thereof output from the multiplexer MUX 1. When the multiplexer MUX 1 is gated and the output is bit 3=0, the output of the OR gate is 1; whereas when the output of the multiplexer MUX 1 is bit 7=1, the output of the OR gate is 0. This indicates an error is caused to bit 3, and then the bit 3 is output to the correcting unit for error correction by means of controlling the gating of the multiplexer MUX 2. With respect to the scenario where the inputs of bit 3 and bit 7 are correspondingly [10], this scenario is similar to the scenario where the inputs of bit 3 and bit 7 are correspondingly [01], which is not described herein any further.

Figure 11:
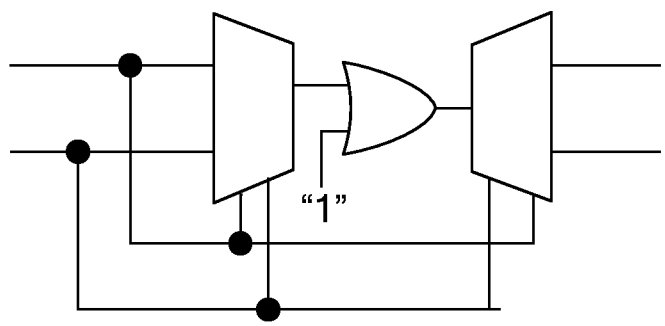
FIG. 11 is a schematic structural diagram of a specific implementation circuit of an erroneous bit determining unit according to an eleventh embodiment of the present disclosure.

In addition, when it is preliminarily judged that the data of the at least one possible erroneous bit in the code word is [0 0], since the output of the OR gate is 1 when the data is gated by the multiplexer MUX 1 and output to the OR gate for an Exclusive OR operation with 1, the erroneous bit may not finally determined. Therefore, the erroneous bit determining unit 902 may further include: a circuit (not shown in FIG. 11) similar to the circuit of the checking unit as illustrated in FIG. 6. By virtue of the circuit of similar to the circuit of the checking unit as illustrated in FIG. 6, the weight of the 4-bit information symbol in the 8-bit code word to be checked is determined, and thus the erroneous bit is finally determined. For example, if the weight of the information symbol is an even number, relative to the code word generated by the code word generating circuit, the weight of the information symbol is not changed, which indicates that the final erroneous bit is located in the check symbol. If the inputs of bit 3 and bit 7 are correspondingly [0 0], it indicates that an error is caused to bit 3 instead of bit 7.

The erroneous bit determining circuit may further include: a correcting unit 905, configured to correct a practical erroneous bit based on a pre-known error type. The final erroneous bit is output by the multiplexer MUX 2 to the correcting unit, and the correcting unit is enabled by an enable signal to correct the erroneous bit.

Specifically, the correcting unit may include a first correcting unit 915 and a second correcting unit 925. The first correcting unit 915 is configured to correct a practical erroneous bit in the information symbol based on a pre-known error type. That is, if the practical erroneous bit is located in the information symbol, the first correcting unit 915 is enabled by an enable signal to correct the corresponding erroneous bit. The second correcting unit 925 is configured to a practical erroneous bit in the check symbol based on a pre-known error type. That is, if the practical erroneous bit is located in the check symbol, the second correcting unit 925 is enabled to correct the corresponding erroneous bit.

The first correcting unit and the second correcting unit may be specifically a reference Exclusive OR gate circuit, 1-2 multiplex distributor or the like, which is not described herein any further, as long as the erroneous bit is corrected from 0 to 1.

The apparatus according to the embodiments of the present application may be practiced by a computer program. A person skilled in the art should understand the above division of units and modules is only an exemplary one, and if the apparatus is divided into other units or modules or not divided, the technical solution shall also fall within the protection scope of the present application as long as the information object has the above functions.

A person skilled in the art shall understand that the embodiments of the present application may be described to illustrate methods, apparatuses (devices), or computer program products. Therefore, hardware embodiments, software embodiments, or hardware-plus-software embodiments may be used to illustrate the present application. In addition, the present application may further employ a computer program product which may be implemented by at least one non-transitory computer-readable storage medium with an executable program code stored thereon. The non-transitory computer-readable storage medium comprises but not limited to a disk memory, a CD-ROM, and an optical memory.

The present disclosure is described based on the flowcharts and/or block diagrams of the method, apparatus (device), and computer program product. It should be understood that each process and/or block in the flowcharts and/or block diagrams, and any combination of the processes and/or blocks in the flowcharts and/or block diagrams may be implemented using computer program instructions. These computer program instructions may be issued to a computer, a dedicated computer, an embedded processor, or processors of other programmable data processing device to generate a machine, which enables the computer or the processors of other programmable data processing devices to execute the instructions to implement an apparatus for implementing specific functions in at least one process in the flowcharts and/or at least one block in the block diagrams.

These computer program instructions may also be stored a non-transitory computer-readable memory capable of causing a computer or other programmable data processing devices to work in a specific mode, such that the instructions stored on the non-transitory computer-readable memory implement a product comprising an instruction apparatus, where the instruction apparatus implements specific functions in at least one process in the flowcharts and/or at least one block in the block diagrams.

These computer program instructions may also be stored on a computer or other programmable data processing devices, such that the computer or the other programmable data processing devices execute a series of operations or steps to implement processing of the computer. In this way, the instructions, when executed on the computer or the other programmable data processing devices, implement the specific functions in at least one process in the flowcharts and/or at least one block in the block diagrams.

Although the preferred embodiments of the present application are described above, once knowing the basic creative concept, a person skilled in the art can make other modifications and variations to these embodiments. Therefore, the appended claims are intended to be construed as covering the preferred embodiments and all the modifications and variations falling within the scope of the present application. Obviously, a person skilled in the art can make various modifications and variations to the present application without departing from the spirit and scope of the present application. In this way, the present application is intended to cover the modifications and variations if they fall within the scope of the appended claims of the present application and equivalent technologies thereof.

What is claimed is:

1. A method for generating a code word, comprising:

respectively performing a Hamming operation for an information symbol having an even weight and an information symbol having an odd weight to acquire a check symbol configured for the information symbol having an even weight and a check symbol configured for the information symbol having an odd weight;

respectively generating a code word based on the information symbol having an even weight and the information symbol having an odd weight and the check symbols configured therefor, and performing an even parity for the code word, and transmitting the information symbol having the even weight to the first Exclusive OR unit such that an Exclusive OR operation is performed between the information symbol having the even weight and the first Hamming matrix, wherein the respectively performing a Hamming operation for an information symbol having an even weight and an information symbol having an odd weight to acquire a check symbol configured for the information symbol having an even weight and a check symbol configured for the information symbol having an odd weight comprises: respectively performing an Exclusive OR operation for the information symbol having an even weight and the information symbol having an odd weight with an assigned Hamming matrix to acquire different check symbols configured for the information symbol having an even weight and for the information symbol having an odd weight respectively, wherein the respectively performing an Exclusive OR operation for the information symbol having an even weight and the information symbol having an odd weight with an assigned Hamming matrix to acquire different check symbols configured for the information symbol having an even weight and for the information symbol having an odd weight respectively comprises:

respectively performing the Exclusive OR operation for the information symbol having an even weight with a first Hamming matrix and a second Hamming matrix to acquire the check symbol configured for the information symbol having an even weight; and performing the Exclusive OR operation for the information symbol having an odd weight with the second Hamming matrix to acquire the check symbol configured for the information symbol having an odd weight; or respectively performing the Exclusive OR operation for the information symbol having an even weight with a full-code Hamming matrix to acquire the check symbol configured for the information symbol having an even weight; and performing the Exclusive OR operation for the information symbol having an odd weight with the second Hamming matrix to acquire the check symbol configured for the information symbol having an odd weight.

2. The method according to claim 1, further comprising: separating an input information symbol to acquire the information symbol having the even weight and the information symbol having the odd weight.

3. The method according to claim 1, further comprising:
preliminarily determining, based on a check relationship between an information symbol and a check symbol in a code word to be checked, at least one possible erroneous bit in the code word to be checked; and
determining an actual erroneous bit in the at least one possible erroneous bit based on a weight variation of the information symbol or the check symbol in the code word to be checked relative to the information symbol or the check symbol in the code word.

4. The method according to claim 3, wherein the preliminarily determining, based on a check relationship between an information symbol and a check symbol in the code word to be checked, at least one possible erroneous bit in the code word to be checked comprises: performing an Exclusive OR operation between the information symbol and the check symbol in the code word to be checked, performing a Hamming check for a result of the Exclusive OR operation, and preliminarily determining at least one possible erroneous bit in the code word to be checked.

5. The method according to claim 4, wherein prior to the performing an Exclusive OR operation between the information symbol and the check symbol in the code word to be checked, the method comprises: aligning the information symbol and the check symbol in the code word to be checked, to perform the Exclusive OR operation between the aligned information symbol and check symbol in the code word to be checked.

6. The method according to claim 3, wherein the preliminarily determining, based on a check relationship between an information symbol and a check symbol in a code word to be checked, possible erroneous bits in the code word comprises: separating the code word to be checked to acquire the information symbol and the check symbol of the code word to be checked.

7. A code word generating circuit, comprising:
a Hamming operating unit, configured to respectively perform a Hamming operation for an information symbol having an even weight and an information symbol having an odd weight to acquire a check symbol configured for the information symbol having an even weight and a check symbol configured for the information symbol having an odd weight;
a code word generating unit, configured to respectively generate a code word based on the information symbol having an even weight and a check symbol configured for the information symbol having an odd weight and the check symbols configured therefor; and
a first checking unit, configured to perform an even parity for the code word, and transmit the information symbol having the even weight to the first Exclusive OR unit such that an Exclusive OR operation is performed between the information symbol having the even weight and the first Hamming matrix,
wherein the Hamming operating unit comprises: a first Exclusive OR unit and a second Exclusive OR unit; wherein the first Exclusive OR unit is configured to respectively perform an Exclusive OR operation for the information symbol having an even weight with a first Hamming matrix and a second Hamming matrix to acquire the check symbol configured for the information symbol having an even weight, and the second Exclusive OR unit is configured to perform an Exclusive OR operation for the information symbol having an odd weight with the second Hamming matrix to acquire the check symbol configured for the information symbol having an odd weight; or
wherein the Hamming operating unit comprises: a third Exclusive OR unit and a fourth Exclusive OR unit; wherein the third Exclusive OR unit is configured to respectively perform an Exclusive OR operation for the information symbol having an even weight with a full-code Hamming matrix to acquire the check symbol configured for the information symbol having an even weight, and the fourth Exclusive OR unit is configured to perform an Exclusive OR operation for the information symbol having an odd weight with the second Hamming matrix to acquire the check symbol configured for the information symbol having an odd weight.

* * * * *